United States Patent [19]

Stark et al.

[11] 4,215,413

[45] Jul. 29, 1980

[54] MEASURING DEVICE FOR INTEGRAL VALUES FORMED OVER A TIME SPAN

[75] Inventors: Reinhard Stark; Günter Steinmüller, both of Nuremberg, Fed. Rep. of Germany

[73] Assignee: Siemens Aktiengesellschaft, Munich, Fed. Rep. of Germany

[21] Appl. No.: 920,253

[22] Filed: Jun. 29, 1978

[30] Foreign Application Priority Data

Jun. 30, 1977 [DE] Fed. Rep. of Germany ....... 2729617

[51] Int. Cl.² .................. G06M 3/14; G01F 1/00
[52] U.S. Cl. .................. 364/570; 235/92 DP; 364/510; 364/734; 364/900
[58] Field of Search .......... 364/509, 510, 570, 728, 364/900, 442, 556, 561, 565, 734, 200; 235/92 DP, 92 FQ; 324/160, 161, 178; 307/220 R, 221 R; 179/156

[56] References Cited

U.S. PATENT DOCUMENTS

| | | | |
|---|---|---|---|
| 3,344,406 | 9/1967 | Vinal | 364/900 |
| 3,603,769 | 9/1971 | Malcolm | 235/92 FQ |
| 4,020,286 | 4/1977 | Ceci | 179/1 SC |
| 4,025,772 | 5/1977 | Constant | 364/728 |
| 4,032,755 | 6/1977 | Bard et al. | 364/442 |
| 4,086,470 | 4/1978 | Ashbee | 235/92 DP |
| 4,101,071 | 7/1978 | Brejnik et al. | 235/92 DP |
| 4,104,990 | 8/1978 | Frobenius | 364/442 |

FOREIGN PATENT DOCUMENTS 2446602  4/1976  Fed. Rep. of Germany .

*Primary Examiner*—Errol A. Krass
*Attorney, Agent, or Firm*—Kenyon & Kenyon

[57] ABSTRACT

In a measuring device for integral values formed over a time span which is constantly up-dated, the system being one in which pulses represent a fixed quantity of the value being measured, the pulses are stored in a random access memory of a microcomputer with the central processing unit of the microcomputer sequentially addressing individual memory cells, in a repetitive manner after each sweep of the time span.

2 Claims, 3 Drawing Figures

| | | | | | | | |
|---|---|---|---|---|---|---|---|
| Address | | 74 | 75 | 76 | 77 | 78 | 79 |
| Content of the RAM cells | | 12 | 9 | 8 | 8 | 7 | 6 |
| Number of Arriving Pulses | | 3 | 5 | 8 | 9 | 12 | 14 |
| Instantaneous Storage | 123 | 114 | 110 | 110 | 111 | 116 | 124 |

MEASURING DEVICE FOR INTEGRAL VALUES FORMED OVER A TIME SPAN

BACKGROUND OF THE INVENTION

This invention relates to measuring in general and more particularly to an improved measuring device for integral values formed over a time span which is constantly up-dated.

Systems are known in which the object of measurement provides an output in the form of series of pulses, each pulse representing a fixed quantity. For example, a rotating flow meter might output one pulse per rotation with each rotation representing a predetermined quantity of liquid. Staying with the same example, assume that each pulse represents 10 cc. Thus, 100 pulses would represent one liter. Suppose it is desired to determine the flow rate in liters per minute. If one counts pulses for one minute the count will be porportional to the flow in liters per minute after a division by one hundred. For example, if the count is 123 pulses that means that the flow rate is 1.23 liters per minute.

Apparatus for making measurements of this nature has been developed and is disclosed in German Offenlegungsschrift 24 46 602. The incoming pulses are fed to a flip-flop having its output coupled to a shift register which is caused to shift by a clock operating at a frequency which is at least as great as the maximum pulse rate input of the measurement quantity. The incoming pulses representing a predetermined quantity act to set the flip-flop. On the next clock pulse this data is transferred to the shift register and the flip-flop reset. The shift register has a length corresponding to the maximum measurable rate, i.e., if the time span over which the measurement is to take place is one minute and if the clock rate is, for example, 200 pulses per minute, then the shift register would have 200 stages. Going back to the example given, this would mean that the maximum rate of the flow meter which could be sensed would be 200 pulses per meter or two liters per minute. Because the shift register is constantly operating it will give the instantaneous average or integral value at any given time. In other words, it is constantly up-dated. With each clock pulse the one minute time integral of the example is shifted 1/200 of a minute. In order to provide an output which corresponds to what it is stored in the shift register in convenient fashion, the input to the shift register is also coupled as the up count to a forward-backward counter. The output of the last stage of the shift register is coupled as the down count. In this manner, the count in the counter always exactly equals the number of pulses in the shift register. Each time a pulse is taken out of the shift register a pulse is taken out of the counter and each time a pulse is added to the shift register a pulse is added to the counter. The counter output is then used to drive an LED display to give a constant indication of the integral value being measured. In the example given above, the output of the counter could be decoded in a binary to decimal decoder and used to drive a LED display which read directly in liters per minute.

In another similar type of measuring device not all components are electronic. Instead of the counter and display, an electro mechanical device such as a stepper motor is driven in one direction, i.e., forward, by the pulses entering the shift register and in the other direction, i.e., backward, by the pulses leaving the shift register. In this manner the angle of rotation of the electro mechanical device corresponds to the content of the shift register. Again, an output indication such as a reading in liters per minute directly becomes possible.

In both of the above-mentioned devices a shift register is utilized into which the pulses representing a fixed quantity are inserted serially bit by bit with the shifting clock rate constant and at least as high as the maximum pulse rate which is to be received at the input.

SUMMARY OF THE INVENTION

It is an object of the present invention to simplify a measuring device of the general type described above.

According to the present invention this is accomplished by using, instead of a shift register, a random access memory (RAM) of a microcomputer to store the incoming pulse information. In this system, the central processing unit (CPU) of the microcomputer is used to address the individual memory cells sequentially. A number of memory cells sufficient to store the information over a given time period is used. Once these have been gone through sequentially over that time period, the sequence is again repeated. In accordance with the present invention, when a pulse arrives it is written into the next memory location as a "1". In order to keep a running record, i.e., to perform the function which the counter performs in the prior art device, a storage register in the microcomputer is used. Each time a memory location is loaded, that memory location is first read and the quantity therein subtracted from the register, which hereinafter will be referred to as the instantaneous value register. Then the value which is being read into the memory is read in that location and also added to the instantaneous memory register. In a fashion similar to the prior art device using the shift register, the CPU addresses one cell of the RAM after another at constant time intervals, addressing the cells from 0 to n. In a RAM, each memory cell is addressable, i.e., the memory cell corresponding to the address which is selected is always written into, cleared or read depending on the command given. Each time a pulse arrives, the next memory cell, it is stored in the next cell which is accessed. The previously stored value is subtracted from the instantaneous memory register, and the received pulse value, i.e., "1" written both into the address cell and the instantaneous memory. After all cells have been gone through and the cell n is reached addressing starts at 0 again. Following this procedure, the value in the instantaneous memory register will always be equal to the sum of the values stored in all the memory cells and will thus represent the instantaneous value over the time span under consideration.

Since in conventional microcomputers the memories are not normally organized as $n \times 1$ bits, but are more commonly organized as $n \times 4$ or $n \times 8$ bits, it is necessary either to leave a large part of the memory unused when applying the method just described or it becomes necessary to take additional measures such as working with mask commands. However, in accordance with a further feature of the present invention, fast processing and good utilization of the memory are obtained by combining the fixed quantity pulses into n bit coded groups and increasing the addressing interval for the memory by n time intervals. The fact that several arriving pulses are combined in groups results in considerably reduced storage requirements. A RAM organization of $n \times 4$ bits means that one cell contains 4 bits. This in turn means that it is possible to store 15 input pulses in binary fashion in each cell. This in turn permits the sampling interval of the memory to be increased by a factor of 15.

DETAILED DESCRIPTION OF THE INVENTION

Figures 1, 3:
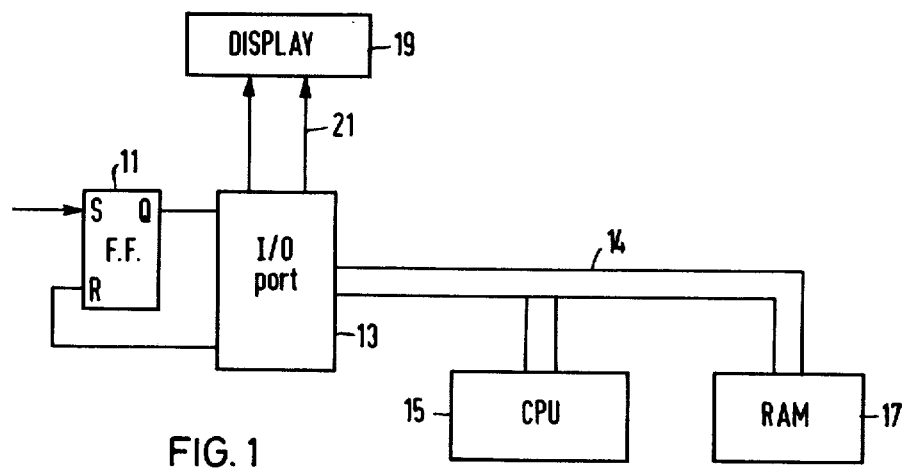
FIG. 1 is a block diagram of the system of the present invention.
FIG. 3 is a diagram helpful in understanding the operation of the system described in connected with FIGS. 1 and 2.

FIG. 1 is a block diagram of the system of the present invention. Included is a flip-flop 11 which is set by the pulses of the incoming pulse train each pulse of which represents a fixed amount of the quantity being measured. The output of the flip-flop 11 is coupled to an input/output port (I/O port). The I/O port is coupled over a data and address bus 14 to a central processing unit 15 of a microcomputer. Also coupled over this bus 14 is a random access memory 17. The I/O port provides an output to reset the flip-flop 11 and also provides an output to a display 19 over a bus 21.

Figure 2:
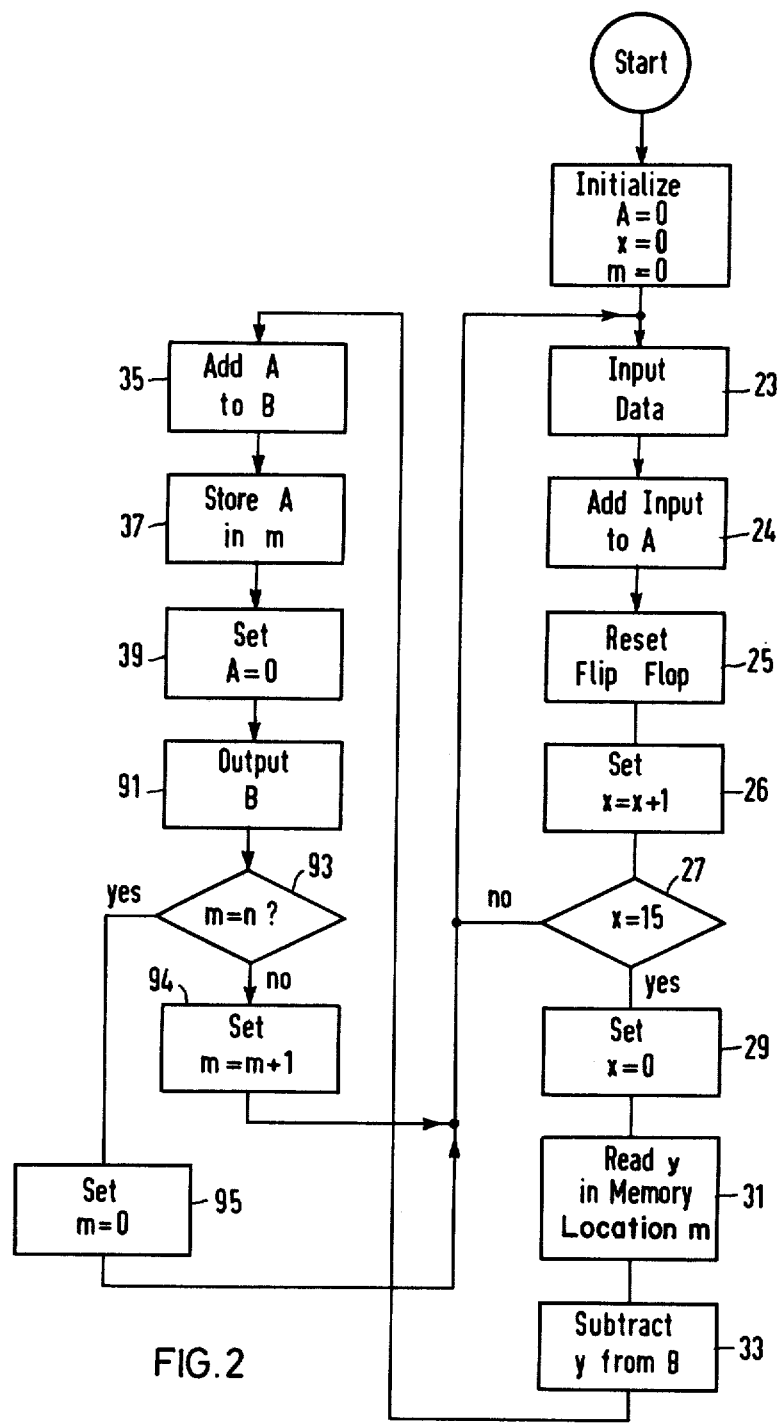
FIG. 2 is a flow diagram showing the operation of the present invention using the system of FIG. 1.

The operation of this system can best be understood by examining FIG. 1 in conjunction with FIG. 2 which is a flow diagram for the device of the present invention. An incoming pulse sets flip-flop 11. In accordance with the program stored within the CPU 15 and in accordance with block 23, data is input. What this requires is that the I/O port at its input from the flip-flop be sampled at a rate greater than the maximum input pulse of the pulses 25 coming into the flip-flop 11. The central processing unit 15 addressed the input section of the input port 13. Then, in accordance with block 24, it adds whatever it has found at the input port to an internal register designated herein as register A. Next, the I/O port 13 is addressed again to output a reset signal to the flip-flop. Then, a value in an internal counter designated x is set equal to x+1, as indicated by block 26. Thereafter, a check is made to see if x is equal to 15. If the answer is no, the program loops back to gether more data. This is repeated 15 times. After 15 passes are made through this loop the answer at block 27 is yes and a block 29 is entered indicating that x should be set to 0. The next item to be done is to read the value y from the memory location m. Then, as indicated by block 33 the value y is subtracted from a register B, the B register being the instantaneous memory register referred to above. Next, the x value in register A is added to the value in register b as indicated by block 35 and then the value in register A stored in location m as indicated by block 37. Register A is then set to 0 as indicated by block 39 and the value in register B provided as an output to the display 19 as indicated by block 41. Preferably, the I/O port 13 will be one capable of storing the values output so that, between up-dates the stored value will remain on the bus 21 activating the display 19. Alternatively such storage can be built into the display 19. The program next goes to a decision block 43 where a check is made to see if m is equal to n, n being the last memory location. If the answer is no, m is set equal to m plus 1 and the program goes back to block 23. When m equals n, meaning that all memory locations have been gone through, the answer at the output block 43 is yes and a block 45 is entered where m is set back to 0 and, once again block 23 is entered.

FIG. 3 illustrates the system in action over a portion of the scan of the n memory locations. The instantaneous value in the register designated in FIG. 2 as B, is assumed to be 123. This is the value that has been provided as an output to display 19. In the example given above, where flow was measured in liters per minute, this could be displayed as 1.23 liters per minute, for example, Blocks 23–26 are run through 15 times. In other words, the output of flip-flop 11 is sampled 15 times and each time, if there is a "1" present, it is added to the input of register A. In the example shown on FIG. 3, during this period only three pulses are detected. Thus, when x reaches 15, the value in register A is equal to three. Memory address 74 is accessed and the value, 12, stored therein read and subtracted from B. Next, three is added to B and is also stored in the location 74. As shown, the instantaneous value in register B is now 114 and, in accordance with the instruction of block 41, the display 19 will be up-dated to give this reading. Similarly, when, after 15 more samples are taken, with an input of 5 pulses counted during that period, the 5 is added to the 114 while at the same time 9 stored in memory location 75 is subtracted to give an end result of 110. During the next sampling increment 8 pulses are received and 8 pulses were previously stored in memory location 76 so that the count remains the same. Similar examples are shown for the memory locations 77, 78 and 79.

What is claimed is:

1. A measuring device for integral values formed over a constant time span which is constantly updated, said device receiving, as inputs, pulses representing a fixed quantity of a parameter being measured, comprising:
  (a) a flip-flop having as setting inputs, the pulses representing a fixed quantity; and
  (b) a microcomputer having at least a central processing unit and a random access memory and having the output of said flip-flop as an input, said central processing unit programmed to sequentially address the memory cells of said random access memory for equal time intervals which are shorter than the shortest possible interval between said pulses and to reset said flip-flop before addressing the following one of said memory cells, all of said memory cells being consecutively accessed in a period equal to said fixed time span, whereafter the sequence of the accessing is repeated, said central processing unit further programmed to write a "1" into said memory cell being accessed for each arriving pulse sensed at said flip-flop, said central processing unit further programmed to add, to a memory location representing an instantaneous value, a "1" for each pulse received and at the same relative time to subtract from said memory location, the value that was stored in said memory cell being accessed during the preceding period.

2. Apparatus according to claim 1 wherein said random access memory has a format of n bits and wherein said microcomputer is adapted to combine the incoming pulses into n bit coded groups and increment through the memory at a time interval which is increased n times that which it would be if bits were written singly in each memory location.

* * * * *